United States Patent
Toyama

(10) Patent No.: US 7,288,793 B2
(45) Date of Patent: Oct. 30, 2007

(54) SEMICONDUCTOR LASER

(75) Inventor: Tomoichiro Toyama, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 79 days.

(21) Appl. No.: 10/990,376

(22) Filed: Nov. 18, 2004

(65) Prior Publication Data

US 2005/0110030 A1    May 26, 2005

(30) Foreign Application Priority Data

Nov. 20, 2003    (JP) .............................. 2003-390376

(51) Int. Cl.
*H01L 27/15* (2006.01)
(52) U.S. Cl. .......................................... 257/79; 438/22
(58) Field of Classification Search .................. 372/43, 372/44, 45, 46; 257/458, 79, 700–703, 83; 438/22, 48
See application file for complete search history.

(56) References Cited

U.S. PATENT DOCUMENTS

| 5,189,680 A | * | 2/1993 | Kimura | .................. 372/46.014 |
| 2002/0014674 A1 | * | 2/2002 | Hideyoshi et al. | ........... 257/458 |
| 2002/0044583 A1 | * | 4/2002 | Samonji et al. | ................ 372/46 |

FOREIGN PATENT DOCUMENTS

| JP | 61-107782 | 5/1986 |
| JP | 11-233896 | 8/1999 |
| JP | 2001-185811 | 7/2001 |
| JP | 2003-086886 | 3/2003 |

OTHER PUBLICATIONS

Hashimoto, Jun-ichi et. al., "A Highly Reliable GaInAs-GaInP 0.98-micro-m Window Laser", IEEE Journal of Quantum Electronics, vol. 36, No. 8, Aug. 2000 (p. 971-977).*
Japanese Office Action, May 2, 2007.

* cited by examiner

*Primary Examiner*—Sara Crane
*Assistant Examiner*—Ajay Arora
(74) *Attorney, Agent, or Firm*—Rabin & Berdo, PC

(57) ABSTRACT

A light emitting layer forming section (8) including an n-type conductivity type clad layer (2), an active layer (3) and p-type conductivity type clad layers (4) and (6) is laminated on a semiconductor substrate (1), and further, a contact layer (9) made of a material having substantially the same lattice constant and thermal expansion coefficient as those of the semiconductor substrate is laminated on the light emitting layer forming section. The light emitting layer forming section and the contact layer are formed in such a manner as to satisfy the following inequality: $1.5 \leq (d_1/d_2) \leq 2.8$, where $d_1$ represents the thickness of the contact layer, and $d_2$ represents the thickness of the light emitting layer forming section. As a consequence, it is possible to provide a semiconductor laser for a high output, in which a COD level can become high and a lifetime can be prolonged even if the light emitting layer forming section is as thick as 4 μm or more.

8 Claims, 3 Drawing Sheets

LIGHT EMITTING PORTION

SEMICONDUCTOR LASER

FIELD OF THE INVENTION

The present invention relates to a semiconductor laser specially suitable for use in a pick-up light source for a CD, a digital versatile disk (hereinafter, referred to as "a DVD"), a DVD-ROM, a data writable CD-R/RW or the like. More particularly, the present invention relates to a semiconductor laser, in which a COD level is high even at a high output and a lifetime can be prolonged.

BACKGROUND OF THE INVENTION

For example, an infrared high output semiconductor laser having a wavelength of 780 nm is configured in a structure shown in FIG. 6. Specifically, on a semiconductor substrate 21 made of an n-type GaAs are laminated in order a lower clad layer 22 formed of, for example, an n-type AlGaAs based compound semiconductor; an active layer 23 formed of a non-doped, n-type or p-type AlGaAs based compound semiconductor; and an upper first clad layer 24 formed of a p-type AlGaAs based compound semiconductor. Furthermore, on the resultant lamination are laminated an etching stop layer 25 made of, for example, a p-type InGaP; an upper second clad layer 26 formed of a p-type AlGaAs based compound semiconductor; and a cap layer 27 made of GaAs. The resultant lamination is etched by wet etching, thereby forming a ridge 28.

Thereafter, a current block layer 29 made of, for example, an n-type AlGaAs based compound semiconductor is formed on both sides of the ridge 28 by selective growth. Thus, all layers from the lower clad layer 22 to the cap layer 27 and the current block layer 29 constitute a light emitting layer forming section 31, on which a contact layer 30 made of, for example, p-type GaAs is then laminated. A p-side electrode 32 is disposed on the contact layer 30; in contrast, an n-side electrode 33 is disposed on the reverse of the substrate 21.

With this structure, the semiconductor substrate 21 is normally formed in a thickness of about 50 µm, and further, the contact layer 30 is normally formed in a thickness of about 1 µm to about 3 µm. This semiconductor laser is mounted in a face down (i.e., junction down) structure, in which the p-side electrode 32 serving as an upper electrode is bonded to a sub mount or the like, thereby facilitating dissipation of heat generated in the light emitting layer forming section 31. As a consequence, the contact layer 30 is formed in as small a thickness as about 1 µm to about 3 µm, as described above. Moreover, in order to obtain a high output of 60 mW or more, a near field pattern need be enlarged. The thickness of the light emitting layer forming section 31 including the upper and lower clad layers 22, 24 and 26 and the active layer 23 should be in the range of about 4 µm to about 6 µm, so as to enlarge a beam spot P to be formed at the light emitting layer forming section 31.

In addition, as disclosed in Japanese Patent Application Laid-Open No. 2003-86886, a distance from the active layer to the reverse surface of the semiconductor substrate is made to be substantially equal to a thickness from the active layer to the upper surface of the contact layer, and as a consequence, wherein the thickness of the contact layer is set to, for example, about 50 µm and, more particularly, to 60 µm or less. In this manner, a reflection quantity due to a return light beam is reduced when a semiconductor laser is used for an optical pick-up, and it is possible to prevent degradation of an S/N of a reading signal by detecting the return light beam by a light receiving element even if the return light beam reaches an optical disk again.

However, as described above, the semiconductor laser for a high output by increasing the thickness of the light emitting layer forming section has raised problems that a catastrophically optical damage (hereinafter, referred to as "a COD") level is low, operation for a long period of time (an aging test at high temperatures) often induces breakage, a lifetime is short, and reliability is low.

SUMMARY OF THE INVENTION

The present invention has been accomplished to solve the above-described problem experienced in the prior art. Therefore, an object of the present invention is to provide a semiconductor laser for a high output, in which a COD level can become high and a lifetime can be prolonged even if a light emitting layer forming section is as thick as 4 µm or more.

The present inventor earnestly and repeatedly examined a cause of occurrence of breakage of a semiconductor laser in as short a period of time as from 100 hours to 250 hours when the semiconductor laser for a high output was subjected to an acceleration lifetime test at a high temperature (for example, 75° C.) with a high output (for example, 200 mw), and as a result, found the followings: since GaAs for general use as a material of the semiconductor substrate 21 and an AlGaAs based compound semiconductor in the light emitting layer forming section were slightly different in lattice constant and thermal expansion coefficient of the material, and further, the light emitting layer forming section was thick, distortion occurred at the semiconductor layer in the light emitting layer forming section, and then, induced formation of a cleavage step F at the semiconductor layer (that is, the lower clad layer 22) at the time of cleavage, as shown in, for example, FIG. 5A, thereby causing a decrease in COD level on the beginning, and further, decreasing the COD level due to the lifetime test, whereby the semiconductor laser was broken in a short period of time.

Moreover, the inventor found that the somewhat thick contact layer was made of a semiconductor material having substantially the same lattice constant and thermal expansion coefficient as those of the semiconductor substrate, so that a stress to be exerted on the semiconductor layer in the light emitting layer forming section was designed to be exerted from both sides, that is, from the semiconductor substrate and the contact layer, thereby preventing any tension from being applied in only one direction and any occurrence of the cleavage step at the time of the cleavage, to thus prevent any decrease in COD level. Additionally, the inventor found that no stress was accumulated if the light emitting layer forming section was thin, so that there was few influence of the stress; in contrast, the stress was accumulated if the light emitting layer forming section became thick in order to increase a light emitting output, so that the influence of the accumulated stress became large, thus making it necessary to thicken the contact layer according to the thickness of the light emitting layer forming section so as to effectively alleviate the stress on the light emitting layer forming section.

In contrast, the inventor found that heat generated in the light emitting layer forming section could not be satisfactorily dissipated, thereby shortening the lifetime of the semiconductor laser even if the semiconductor laser was mounted in the junction down structure with the excessively thick contact layer. At last, the inventor found that the COD level could be kept high and the semiconductor laser could not be broken even if the acceleration lifetime test was carried out as long a period of time as 500 hours or longer without any formation of the cleavage step at the lower clad layer even if the light emitting layer forming section is as thick as 4 μm or more by forming the contact layer in such a manner as to establish the relationship expressed by the following inequality: $1.5 \leq (d_1/d_2) \leq 2.8$, where $d_1$ represents the thickness of the contact layer, and $d_2$ represents the thickness of the light emitting layer forming section.

A semiconductor laser according to the present invention includes; a semiconductor substrate, a light emitting layer forming section including a first conductivity type clad layer, an active layer and a second conductivity type clad layer, which are laminated on the semiconductor substrate, and a contact layer laminated on the light emitting layer forming section and made of a material having substantially the same lattice constant and thermal expansion coefficient as those of the semiconductor substrate, wherein the light emitting layer forming section and the contact layer are formed in such a manner as to satisfy an inequality: $1.5 \leq (d_1/d_2) \leq 2.8$, where $d_1$ represents the thickness of the contact layer, and $d_2$ represents the thickness of the light emitting layer forming section.

It is preferable that the thickness of the contact layer should be set in such a manner as to satisfy an inequality: $0.2d_3 \leq d_1 \leq 17$ μm, where $d_3$ represents the thickness of the semiconductor substrate.

The light emitting layer forming section is formed of a semiconductor consisting of mainly an AlGaAs based compound semiconductor, and further, is formed in a thickness ranging from 4 μm to 6 μm: in contrast, the semiconductor substrate and the contact layer are made of GaAs. This is specially suitable for a semiconductor laser for a high output. Incidentally, the AlGaAs based compound semiconductor signifies that mixed crystal ratio of Al and Ga can be varied; and the word "mainly" connotes that at least the clad layers and the active layer are formed of the AlGaAs based compound semiconductor and the semiconductor layer made of the semiconductor other than AlGaAs based compound semiconductor may be included.

A semiconductor laser according to the present invention in another aspect includes; a semiconductor substrate, a light emitting layer forming section including a first conductivity type clad layer, an active layer and a second conductivity type clad layer on the semiconductor substrate, which are laminated on the semiconductor substrate, and a contact layer laminated on the light emitting layer forming section, wherein the semiconductor substrate and the contact layer are made of GaAs, and further, the light emitting layer forming section is formed of a semiconductor consisting of mainly an AlGaAs based compound semiconductor, a thickness $d_3$ of the semiconductor substrate ranges from 40 μm to 60 μm, a thickness $d_2$ of the light emitting layer forming section ranges from 4 μm to 6 μm, and a thickness $d_1$ of the contact layer ranges from 7 μm to 17 μm.

With this structure according to the present invention, even if a stress caused by a difference in lattice constant or thermal expansion coefficient between the semiconductor substrate and the light emitting layer forming section is applied to the light emitting layer forming section, since the contact layer becomes as thick as 7 μm to 17 μm, unlike 1 μm to 3 μm in the prior art, the contact layer made of a material having substantially the same lattice constant or thermal expansion coefficient as that of the semiconductor substrate is formed thickly on a side opposite to the semiconductor substrate in the light emitting layer forming section, so that a similar stress acts on the light emitting layer forming section from the side opposite to the substrate. Consequently, the light emitting layer forming section is subjected to the similar stress not from one side but on both sides, thus keeping balance.

As a result, even in the case of the application of external force which is induced by cleavage or the like, no cleavage step is formed in the light emitting layer forming section due to the stress, thereby preventing any decrease in COD level. Even if the COD level is gradually decreased according to acceleration aging, there is a sufficient level up to a breakage level by keeping the initial COD level high, so that the semiconductor laser cannot be broken despite of an aging test for a very long period of time, thus providing the semiconductor laser of high reliability.

In the meantime, when bonding of a laser chip is performed by the face down (i.e., junction down) structure, in which the upper surface is bonded to the sub mount or the like if the contact layer becomes too thick, heat generated in the light emitting layer forming section is badly relieved, thereby deteriorating light emitting characteristics. According to the present invention, the thickness of the contact layer is limited to 2.8 times or less the thickness of the light emitting layer forming section, and therefore, the thickness of the contact layer becomes 14 μm even if the thickness of the light emitting layer forming section is, for example, 5 μm. The heat generated in the light emitting layer forming section can be satisfactorily dissipated by thermal conduction if the thickness of the contact layer is about 14 μm. As a consequence, it is possible to prevent any degradation of the light emitting layer forming section caused by the stress attributable to the difference in thermal expansion coefficient or lattice constant or the heat caused by light emission, thus providing the semiconductor laser of high reliability and keeping the high COD level.

Additionally, the thickness of the contact layer is set in such a manner as to satisfy an inequality: $0.2d_3 \leq d_1 \leq 17$ μm, where $d_3$ represents the thickness of the semiconductor substrate, thus further enhancing the reliability. That is to say, as the semiconductor substrate becomes thicker, the influence of the stress to be exerted on the light emitting layer forming section becomes larger; in contrast, as the semiconductor substrate becomes thinner, the influence of the stress becomes smaller. In view of this, the thickness of the contact layer is limited according to the thickness of the semiconductor substrate, and therefore, the influence of the stress by the semiconductor substrate can be alleviated, thereby further preventing any decrease in COD level and enhancing the reliability. In this case, it is possible to efficiently dissipate the heat generated in the light emitting layer forming section and suppress the degradation of the light emitting layer forming section by setting the upper limit of the thickness of the contact layer to 17 μm even if the semiconductor substrate is thick.

DETAILED DESCRIPTION

Figure 1:
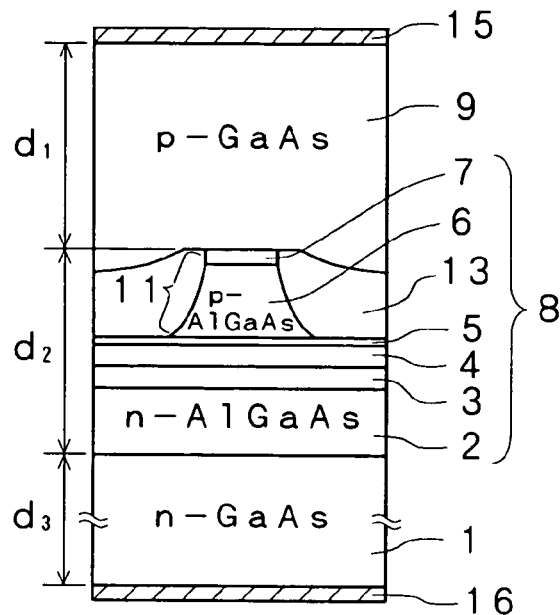
FIG. 1 is a cross-sectional view explanatory of a semiconductor laser in a first preferred embodiment according to the present invention.

A description will be given below of a semiconductor laser according to the present invention in reference to the drawings. In a semiconductor laser according to the present invention, a light emitting layer forming section 8 including a first conductivity type (hereinafter, referred to as "an n-type") clad layer 2, an active layer 3 and second conductivity type (hereinafter, referred to as "a p-type") clad layers 4 and 6 is laminated on a semiconductor substrate 1, and further, a contact layer 9 made of a material having substantially the same lattice constant and thermal expansion coefficient as those of the semiconductor substrate 1 is laminated on the light emitting layer forming section 8, as a cross-sectional view explanatory of a semiconductor laser in a first preferred embodiment is shown in FIG. 1. A feature resides in that the light emitting layer forming section 8 and the contact layer 9 are formed in such a manner as to satisfy the following inequality: $1.5 \leq (d_1/d_2) \leq 2.8$, where $d_1$ represents the thickness of the contact layer 9, and $d_2$ represents the thickness of the light emitting layer forming section 8.

In the semiconductor laser of this type, an AlGaAs based compound semiconductor for a wavelength of 780 nm in an infrared light beam or an InGaAlP based compound semiconductor for a wavelength of 650 nm in a red light beam is used as the light emitting layer forming section 8. Although a GaAs substrate is generally used as the semiconductor substrate 1, on which the above-described semiconductor materials are laminated, other compound semiconductors may be used. A conductivity type of the semiconductor substrate 1 is either an n-type or a p-type, which is a desired conductivity type on the side of the substrate, based on a relationship with incorporation setting of the semiconductor laser, and therefore, the conductivity type of the semiconductor layer to be laminated depends on the conductivity type of the substrate 1. In a concrete example described below, the semiconductor substrate 1 is assumed to be an n-type. The semiconductor substrate 1 has a thickness of about 200 μm to about 400 μm in wafer processing, and then, its reverse is ground to be a thickness $d_3$ of about 40 μm to about 60 μm before an electrode, described later, is formed. Namely, the thickness of the substrate signifies a thickness before cleavage, that is, a thickness after the grinding.

In the example shown in FIG. 1, the light emitting layer forming section 8 includes the n-type clad layer 2, the non-doped, n-type or p-type active layer 3, the p-type first clad layer 4, a p-type etching stop layer 5, the p-type second clad layer 6, a cap layer 7 and an n-type current block layer 13 embedded on both sides of the p-type second clad layer 6 etched in a ridge manner.

Specifically, the n-type GaAs substrate 1 is put into, for example, a metal-organic chemical vapor deposition (abbreviated as "MOCVD") apparatus, and then, a necessary material such as $SiH_4$ as n-type dopant gas, or dimethyl zinc (DMZn) or cyclopentadienyl beryllium $(Be(MeCp)_2)$ as p-type dopant gas is introduced together with hydrogen ($H_2$) serving as carrier gas according to the conductivity type of triethyl gallium (TEG), trimethyl gallium (TMG), trimethyl aluminum (TMA), trimethyl indium (TMIn), phosphine ($PH_3$) or arsine ($ASH_3$) serving as reaction gas and the semiconductor layer, followed by epitaxially growing each of the semiconductor layers at temperatures from about 500° C. to about 700° C., thus obtaining the above-described laminate structure consisting of the semiconductor layers.

The n-type clad layer 2 is made of, for example, $Al_{x1}Ga_{1-x1}As$ ($0.4 \leq x1 \leq 0.7$: for example, $x1=0.5$), and is formed in about 1 μm to about 4 μm. The active layer 3 has a bulk structure made of $Al_{y1}Ga_{1-y1}As$ ($0.05 \leq y1 \leq 0.2$: for example, $y1=0.15$) or a single or multiple quantum well (an SQW or an MQW) structure including a well layer made of $Al_{y2}Ga_{1-y2}As$ ($0.04 \leq y2 \leq 0.2$: for example, $y2=0.1$) and a barrier layer made of $Al_{y3}Ga_{1-y3}As$ ($0.1 \leq y3 \leq 0.5$ and $y2<y3$: for example, $y3=0.3$), and thus, is formed in about 0.04 μm to about 0.2 μm as a whole. The p-type first clad layer 4 is made of, for example, $Al_{x2}Ga_{1-x2}As$ ($0.4 \leq x2 \leq 0.7$: for example, $x2=0.5$), and is formed in about 0.1 μm to about 0.5 μm. Another semiconductor layer may be interposed between any of the layers: for example, optical guide layers may be interposed between the active layer 3 and the clad layers 2 and 4, respectively.

Furthermore, the p-type or undoped etching stop layer 5 made of, for example, $In_{0.49}Ga_{0.51}P$ is formed on the p-type first clad layer 4 in about 0.01 μm to about 0.05 μm. The p-type second clad layer 6 made of, for example, $Al_{x3}Ga_{1-x3}As$ ($0.4 \leq x3 \leq 0.7$: for example, $x3=0.5$) is formed in about 1 μm to about 3 μm. The p-type GaAs cap layer 7 is formed on the p-type second clad layer 6 in about 0.05 μm to about 0.2 μm. A ridge 11 is formed by etching both sides of the cap layer 7 and the p-type second clad layer 6. The current block layer 13 made of $Al_zGa_{1-z}As$ ($0.5 \leq z \leq 0.8$: for example, $z=0.6$) is formed on both sides of the ridge 11 in such a manner as to embed the sides of the ridge 11, thereby forming the light emitting layer forming section 8. As described above, the clad layer need be thickened in the semiconductor laser for the high output, and therefore, the entire thickness $d_2$ of the light emitting layer forming section 8 is set to as great as 4 μm to 6 μm.

Incidentally, the material of the etching stop layer 5 is not limited to $In_{0.49}Ga_{0.51}P$, but it may be, for example, $In_{0.49}(Ga_{0.8}Al_{0.2})_{0.51}P$ and the like; and the cap layer 7 is adapted to prevent any formation of an oxide film on a semiconductor lamination 10 so as to prevent any contamination when the contact layer is grown in a post-process, and therefore, other semiconductor layers may be used; and otherwise, no cap layer may be formed from the beginning as long as only contamination at the surface can be prevented by removing contamination by thermal cleaning before the formation of the contact layer. Moreover, etching for forming the ridge 11 is performed as follows; a mask made of $SiO_2$ or $SiN_x$ is formed by, for example, a CVD method; the cap layer 7 is selectively etched by, for example, dry etching; and subsequently, the p-type second clad layer 6 is etched with an etchant such as HCl, thereby forming the ridge 11 in a stripe-like manner (in a direction perpendicular to the sheet), as shown in FIG. 1. Here, the exposed etching stop layer 5 may be removed.

The contact layer 9 is formed of a p-type GaAs layer in the thickness $d_1$ of about 7 μm to about 17 μm on the light emitting layer forming section 8 and the current block layer 13. In other words, the contact layer 9 is so thickly formed as to alleviate a stress occurring in the light emitting layer forming section 8 by the semiconductor substrate caused by the greater thickness of the light emitting layer forming section 8 while thermal dissipation is secured to some extent according to the present invention, unlike in the prior art structure in which heat generated in the light emitting layer forming section 8 has been readily dissipated in the case where the contact layer 9 has been formed in as thin a thickness as about 1 μm to about 3 μm to be then mounted on a sub mount or the like. As a consequence, the contact layer 9 is preferably made of a material having a lattice constant and a thermal expansion coefficient approximate to those of the semiconductor substrate 1, and specifically, should be preferably a semiconductor made of the same material as that of the semiconductor substrate 1. Thus, in the case where the semiconductor substrate 1 is made of GaAs, the contact layer 9 also should be made of GaAs in the above-described thickness.

On the contact layer 9 is formed a p-side electrode 15 made of Ti/Au or the like; and an n-side electrode 16 made of Au/Ge/Ni or Ti/Au is formed at the reverse surface of the semiconductor substrate 1 after the semiconductor substrate 1 is thinned by grinding, as described above. After this formation of the electrodes, chips are formed from a wafer by the cleavage and so on.

Next, explanation will be made below in detail on the reason why the contact layer 9 must be made of the material having substantially the same lattice constant and thermal expansion coefficient as those of the semiconductor substrate 1 in about 7 μm to about 17 μm. As described above, in order to improve a phenomenon in which the semiconductor laser for the high output is liable to be broken by the acceleration lifetime test in a short period of time, the present inventor has been repeatedly studied with earnestness. As a result, the distortion occurs in the light emitting layer forming section 8 due to the difference in lattice constant or thermal expansion coefficient between the light emitting layer forming section 8 and the semiconductor substrate 1, and causes the cleavage step (i.e., a crack), as indicated by reference character F in FIG. 5A, at the lower clad layer 2 or the like near the semiconductor substrate 1 by external force due to the cleavage when the chips are formed from the wafer. Thus, the present inventor has found that the decrease in COD level due to the step causes breakage in the lifetime test.

That is to say, in the semiconductor laser having a wavelength of, for example, 780 nm, the AlGaAs based compound is used as the semiconductor material of the light emitting layer forming section 8. The GaAs of the semiconductor substrate 1 is 0.5653 nm in the lattice constant and 6.03 ($\times 10^{-6}$/K) in the linear expansion coefficient: in contrast, for example, the $Al_{0.53}Ga_{0.47}As$ is 0.5657 nm in the lattice constant and 5.04 ($\times 10^{-6}$/K) in the linear expansion coefficient. In other words, both of the lattice constant and the linear expansion coefficient are different. Additionally, as described above, it is construed that in the semiconductor laser for the high output, the clad layers 2, 4 and 6 need be made thick, and that the cleavage step F is formed by largely exerting the stress from the semiconductor substrate 1 so as to set the thickness of the light emitting layer forming section 8 to about 5 μm.

Figure 5A:
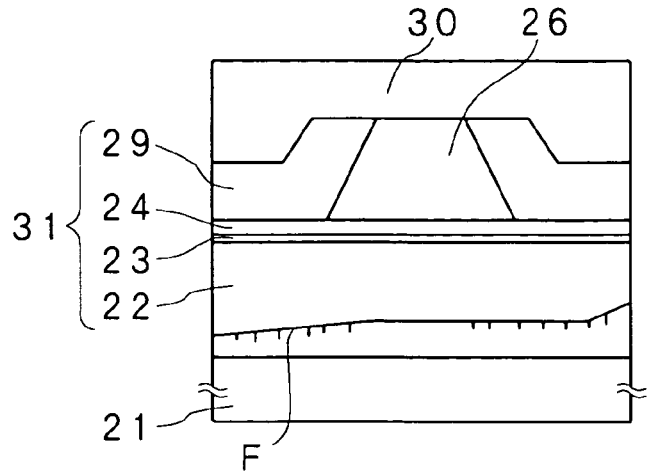
FIGS. 5A and 5B are a view showing a state in which a cleavage step is formed by a semiconductor laser having a conventional structure and a diagram schematically illustrating the interrelationship in stress among layers in that state, respectively.
Figure 5B:
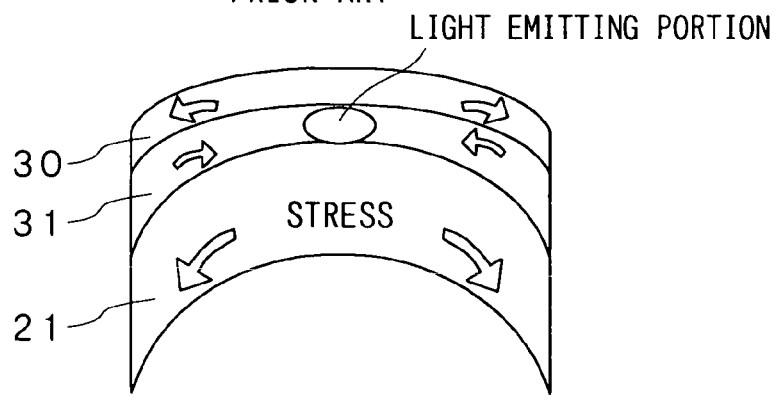
Figure 6:
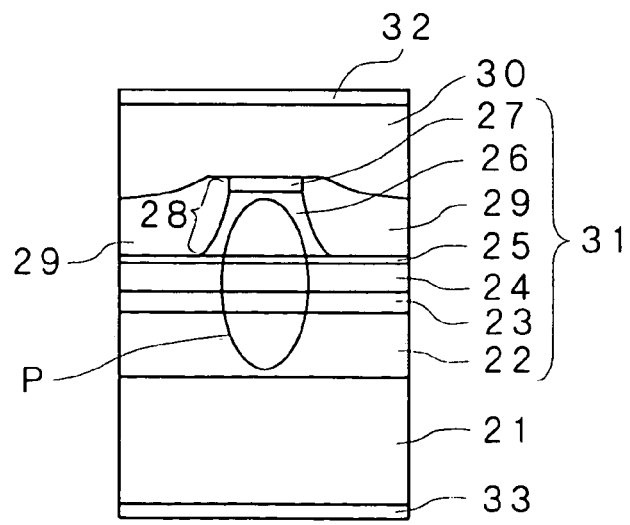
FIG. 6 is a cross-sectional view explanatory of a semiconductor laser having a conventional ridge structure.

The distortion occurring between the semiconductor substrate and the light emitting layer forming section cannot be accumulated to such an extent to form a cleavage step even if there is a few difference in lattice constant or thermal expansion coefficient in the case where a thickness of the light emitting layer forming section is about 3 μm which is not directed to the high output, thereby raising few problem. However, since the distortion is accumulated when a thickness of the light emitting layer forming section is about 4 μm or more which is directed to the high output, the light emitting layer forming section 31 is pulled by the semiconductor substrate 21, and therefore, the distortion is accumulated in the light emitting layer forming section 31, in the semiconductor laser having the thin contact layer in the prior art structure, as a stress relationship is schematically illustrated in FIG. 5B. The contact layer 30 cannot resist against the stress based on the semiconductor substrate 21 if the contact layer 30 is thin, so that a one-sided stress is applied to the light emitting layer forming section 31. In this state, if the external force upon the cleavage or the like is exerted, as illustrated in FIG. 5A, the cleavage step F is undesirably formed at the semiconductor layer in the light emitting layer forming section 31.

Figure 4:
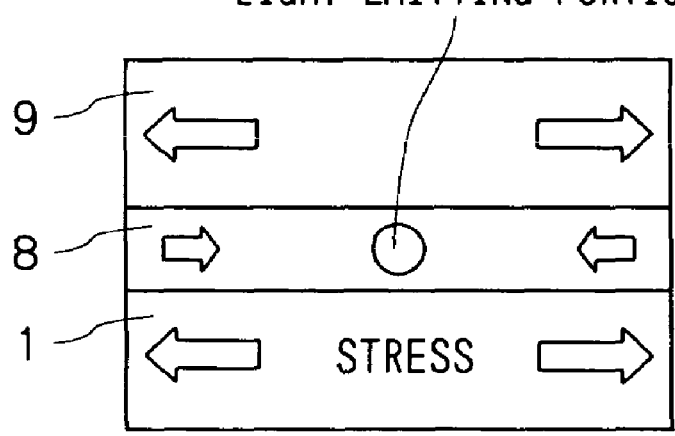
FIG. 4 is a diagram schematically illustrating the interrelationship in stress among a light emitting layer forming section, a semiconductor substrate and the contact layer in a structure shown in FIG. 1.

In the structure of the present invention, the inventor has found that the stress to be exerted on the semiconductor layer in the light emitting layer forming section 8 is exerted in opposite directions on both sides from the semiconductor substrate 1 and the contact layer 9 in the case where the contact layer 9 is made of the semiconductor material, for example, a GaAs, having substantially the same lattice constant and thermal expansion coefficient as those of the semiconductor substrate 1, that is, GaAs is used to form the somewhat thick contact layer 9, as in FIG. 4 schematically illustrating a stress relationship similar to that in FIG. 5B, so that the light emitting layer forming section 8 is not pulled in only one direction, thereby preventing any decrease in COD level without any formation of the cleavage step at the time of the cleavage.

Figure 2A:
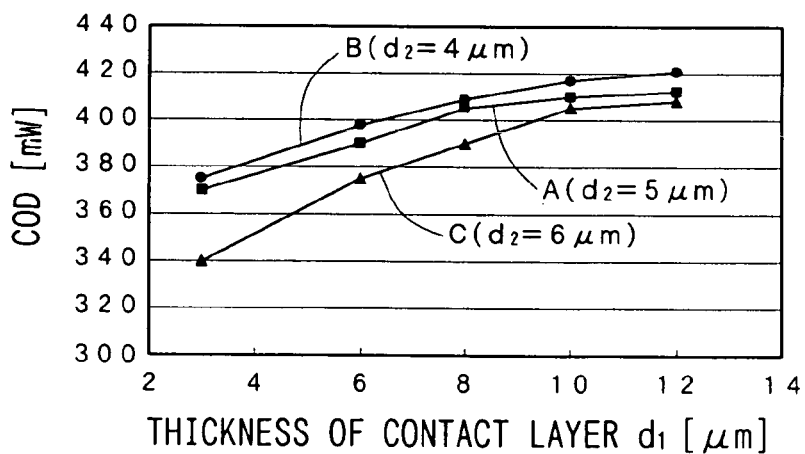
FIGS. 2A and 2B are graphs illustrating variations in COD according to a thickness of a contact layer and variations in COD according to an aging period, respectively.

In the above-described structure shown in FIG. 1 (where the thickness $d_2$ of the light emitting layer forming section is 5 μm), only the thickness of the contact layer 9 is varied with the same structure other than the contact layer 9, and the result of examination of an initial COD according to the variations is represented by a line A in FIG. 2A. The COD with respect to each of the thicknesses is an average of values of 30 samples with the thicknesses. As described above, almost no cleavage step occurs due to the stress if the light emitting layer forming section 8 is thin. Since the thickness of the contact layer 9 is assumed to be largely influenced by the stress with the relationship with the substrate when the thickness $d_2$ of the light emitting layer forming section 8 becomes greater, the thickness $d_2$ of the light emitting layer forming section 8 is set to 4 μm and 6 μm by varying the thickness of the clad layer with a constant near field pattern. The result of examination of variations in COD when the thickness of the contact layer is changed in a similar manner is illustrated in the graph in FIG. 2A, wherein a line B represents the result of the thickness $d_2$ of the light emitting layer forming section 8 being 4 μm, and further, a line C represents the result of the thickness $d_2$ of the light emitting layer forming section 8 being 6 μm.

Figure 2B:
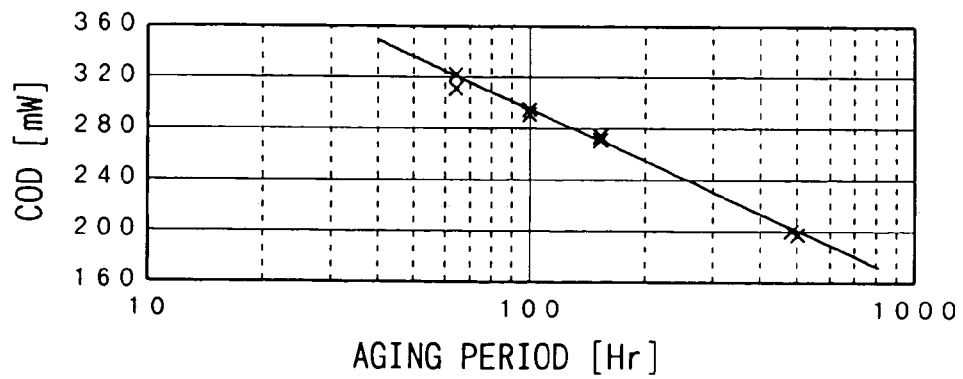

As is clear from FIG. 2A, it is found that the thicker the contact layer 9, the higher the COD level. Incidentally, it is generally known that the COD level is decreased due to aging, as illustrated in FIG. 2B. For example, in an example illustrated in FIG. 2B, the aging is carried out at a temperature of 75° C. by an output of 200 mW, thereby inducing breakage as soon as the COD level is decreased down to 200 mW. In view of this, the initial COD level need be set high. No breakage occurs by setting the COD level up to 400 mW or higher, as illustrated in FIG. 2A, even if the acceleration aging is carried out for 500 hours or longer. From the lines A, B and C in FIG. 2A, when a value obtained by dividing the thickness $d_1$ of the contact layer by the thickness $d_2$ of the light emitting layer forming section is substantially 1.5 or more, the initial COD level becomes 400 mW or more.

Figure 3:
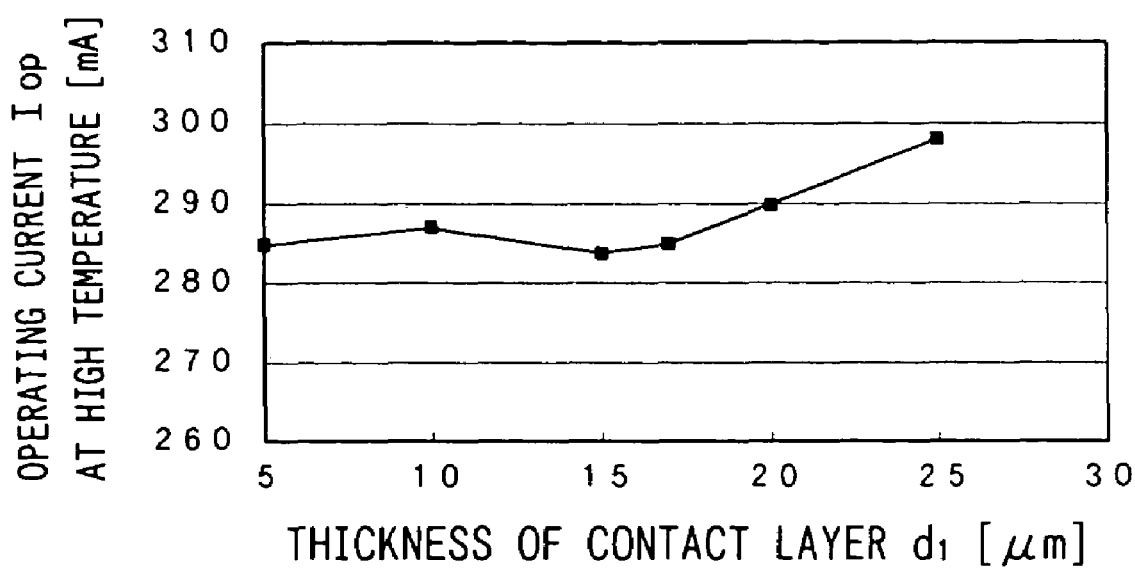
FIG. 3 is a graph illustrating variations in characteristics at high temperature with respect to the thickness of the contact layer.

In contrast, if the contact layer becomes excessively thick, the heat generated in the light emitting layer forming section cannot be sufficiently dissipated despite of the face-down mounting, thereby shortening the lifetime of the semiconductor laser. In other words, the thickness $d_1$ of the contact layer and the poor heat dissipation influence on the high temperature characteristics (i.e., an operating current $I_{OP}$) of the semiconductor laser, the examination result being illustrated in FIG. 3. As illustrated in FIG. 3, when $d_1$ is set to 18 µm or more, the characteristics of the semiconductor laser are degraded. In order to eliminate the adverse influence of the stress caused by the difference in lattice constant or thermal expansion coefficient, it is preferable to make the contact layer 9 thicker. However, the thickness of the contact layer 9 need be 17 µm or less also in consideration of the influence of the heat dissipation characteristics.

Summing up the above-described result of the study, at last, the contact layer was formed in such a manner as to satisfy the relationship expressed by the following inequality: $1.5 \leq (d_1/d_2) \leq 2.8$, where $d_1$ represents the thickness of the contact layer and $d_2$ represents the thickness of the light emitting layer forming section, so that the COD level could be kept high without any formation of the cleavage step or the like on the lower clad layer even if the light emitting layer forming section was as thick as 4 µm or more, and no breakage occurred even if the acceleration lifetime test was carried out for as long a period of time as 500 hours or more.

As described above, the formation of the cleavage step at the light emitting layer forming section depends on the thickness of the light emitting layer forming section, and further, is estimated to depend on the thickness of the semiconductor substrate. As a result of repeated studies by the inventor of the present application, it has been found that the thickness $d_3$ of the semiconductor substrate 1 need be at least 40 µm or more from the viewpoint of breakage prevention at the time of handling in a wafer process, and therefore, that the above-described COD level can be set to 400 mW or higher if the thickness $d_2$ of the light emitting layer forming section 8 ranges from about 4 µm to about 6 µm and 0.2 times or more the thickness $d_3$ of the semiconductor substrate 1. In other words, the above-described thickness of the contact layer or the semiconductor substrate is preferably set in such a manner as to satisfy the following inequality: $0.2 d_3 \leq d_1 \leq 17$ µm in consideration of the above-described heat dissipation characteristics.

From the above-described result of the studies, in the desirable semiconductor laser, the semiconductor substrate 1 and the contact layer 9 are made of GaAs; the light emitting layer forming section 8 is formed of the semiconductor formed of mainly the AlGaAs based compound semiconductor including any layer such as the barrier layer having an Al mixed crystal ratio of 0 (this connotes that the AlGaAs based compound semiconductor may include an InGaP layer or the like); and the thickness $d_3$ of the semiconductor substrate 1 ranges from 40 µm to 60 µm, the thickness $d_2$ of the light emitting layer forming section 8 ranges from 4 µm to 6 µm and the thickness $d_1$ of the contact layer 9 ranges from 7 µm to 17 µm. This is preferable to fabricate the semiconductor laser for the high output of 80 mW or more, more preferably, 100 mW or more in the infrared region in the vicinity of 780 nm. Incidentally, this output signifies a peak output in the case of pulse oscillation.

Additionally, the present invention can be applied not only to the case where the light emitting layer forming section is made of the AlGaAs based compound but also to the case where the light emitting layer forming section is made of a red InGaAlP based compound semiconductor (having a constitution of $In_{0.49}(Ga_{1-w}Al_w)_{0.51}P$ with variations in a mixed crystal ratio of Al and Ga) in the same manner. That is to say, in the InGaAlP based compound semiconductor, the lattice constant relatively approximates to the lattice constant of GaAs with ease, but cannot completely accord with it. Furthermore, the linear expansion coefficient is 5.1 ($\times 10^{-6}$/K) in the case of $In_{0.49}(Ga_{0.3}Al_{0.7})_{0.51}P$, which is different from 6.03 ($\times 10^{-6}$/K) of the above-described linear expansion coefficient of the GaAs, thereby arising a similar problem. However, such a problem can be solved by thickly forming the contact layer according to the present invention in a constant thickness.

The InGaAlP based compound can be constituted in the same manner as in the above-described example except that $In_{0.49}(Ga_{1-u}Al_u)_{0.51}P$ (where $0.45 \leq u \leq 0.8$: for example u=0.7) is used as the above-described n-type and p-type clad layers; for example, the multiple quantum well (MQW) structure made of $In_{0.49}(Ga_{1-v1}Al_{v1})_{0.51}P$ (where $0 \leq v1 \leq 0.25$: for example v1=0)/$In_{0.49}(Ga_{1-v2}Al_{v2})_{0.51}P$ (where $0.3 \leq v2 \leq 0.7$: for example v2=0.4) is used as the active layer; and InAlP or GaAs is used as the current block layer.

According to the present invention, as described above, the thick contact layer is formed in such a manner as to satisfy the relationship expressed by the following inequality: $1.5 \leq (d_1/d_2) \leq 2.8$ even if the light emitting layer forming section for the high output becomes thick, and therefore, the stress acts from not either side but both sides of the semiconductor substrate and contact layer, thereby preventing any distortion from only one direction. Consequently, in the case of the cleavage, no cleavage step is formed at the light emitting layer forming section by the external force, thereby preventing any degradation of the COD. In the meantime, since the upper limit of the thickness of the contact layer is determined, the heat generated at the light emitting layer forming section during the operation can be sufficiently dissipated owing to the mounting on the sub mount in a face down manner, thereby preventing any degradation of the light emitting layer forming section caused by the heat, so as to maintain the high characteristics of the semiconductor laser and achieve the long lifetime of the semiconductor laser.

Although the semiconductor laser having the ridge structure has been described in the above-described examples, it is to be understood that the same should go for semiconductor lasers having other structures such as an SAS structure in which a current block layer is laminated between clad layers to form a current injection region, and then, the resultant stripe groove is removed by etching.

The semiconductor laser according to the present invention can be used as a pick-up light source for a CD, a DVD, a DVD-ROM, a data writable CD-R/RW or the like, and thus, it can be used for electric equipment such as a personal computer.

Although preferred examples have been described in some detail it is to be understood that certain changes can be made by those skilled in the art without departing from the spirit and scope of the invention as defined by the appended claims.

What is claimed is:
1. A semiconductor laser comprising:
    a semiconductor substrate;
    a light emitting layer forming section including a first conductivity type clad layer, an active layer, a second conductivity type first clad layer, a second conductivity type second clad layer, a second conductivity type cap layer on the second conductivity type second clad layer, the second clad layer and the cap layer being etched on both sides to form a ridge, and a first conductivity type current block layer that is embedded on the both sides of the second conductivity type second clad layer and the cap layer, which are laminated on the semiconductor substrate; and a contact layer laminated on the cap layer and the current block layer directly and made of a material having substantially the same lattice constant and thermal expansion coefficient as those of the semiconductor substrate;

wherein the light emitting layer forming section and the contact layer being formed in such a manner as to satisfy an inequality: $1.5 \leq (d_1/d_2) \leq 2.8$, where $d_1$ represents the thickness of the contact layer, and $d_2$ represents the thickness of the light emitting layer forming section.

2. The semiconductor laser according to claim 1, wherein the thickness of the contact layer is set in such a manner as to satisfy an inequality: $0.2d_3 \leq d_1 \leq 17$ μm, where $d_3$ represents the thickness of the semiconductor substrate.

3. The semiconductor laser according to claim 1, wherein the thickness $d_2$ of the light emitting layer forming section ranges from 4 μm to 6 μm.

4. The semiconductor laser according to claim 2, wherein the thickness $d_3$ of the semiconductor substrate ranges from 40 μm to 60 μm.

5. The semiconductor laser according to claim 1, wherein the light emitting layer forming section is formed of a semiconductor consisting of mainly an AlGaAs based compound semiconductor, and further, the semiconductor substrate and the contact layer are made of GaAs.

6. The semiconductor laser according to claim 1, wherein the light emitting layer forming section is formed of a semiconductor consisting of mainly an InGaAlP based compound semiconductor, and further, the semiconductor substrate and the contact layer are made of GaAs.

7. The semiconductor laser according to claim 1, wherein a light emitting output is as high as 80 mW or more.

8. A semiconductor laser comprising:

a semiconductor substrate;

a light emitting layer forming section including a first conductivity type clad layer, an active layer, a second conductivity type first clad layer, a second conductivity type second clad layer, a second conductivity type cap layer on the second conductivity type second clad layer, the second clad layer and the cap layer being etched on both sides to form a ridge, and a first conductivity type current block layer that is embedded on the both sides of the second conductivity type second clad layer and the car layer, which are laminated on the semiconductor substrate; and a contact layer laminated on the cap layer and the current block layer directly;

wherein the semiconductor substrate and the contact layer being made of GaAs, and further, the light emitting layer forming section being formed of a semiconductor consisting of mainly an AlGaAs based compound semiconductor; a thickness $d_3$ of the semiconductor substrate ranging from 40 μm to 60 μm; a thickness $d_2$ of the light emitting layer forming section ranging from 4 μm to 6 μm; and a thickness $d_1$ of the contact layer ranging from 7 μm to 17 μm.

* * * * *